(12) United States Patent
Pietambaram et al.

(10) Patent No.: US 10,714,434 B1
(45) Date of Patent: Jul. 14, 2020

(54) INTEGRATED MAGNETIC INDUCTORS FOR EMBEDDED-MULTI-DIE INTERCONNECT BRIDGE SUBSTRATES

(71) Applicant: Intel Corporation, Santa Clara, CA (US)

(72) Inventors: Srinivas V. Pietambaram, Gilbert, AZ (US); Kristof Darmawikarta, Chandler, AZ (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/236,435

(22) Filed: Dec. 29, 2018

(51) Int. Cl.
*H01L 21/00* (2006.01)
*H01L 23/64* (2006.01)
*H01L 49/02* (2006.01)
*H01L 23/13* (2006.01)
*H01L 21/48* (2006.01)
*H01L 23/538* (2006.01)

(52) U.S. Cl.
CPC ........ *H01L 23/645* (2013.01); *H01L 21/4853* (2013.01); *H01L 23/13* (2013.01); *H01L 23/5381* (2013.01); *H01L 23/5386* (2013.01); *H01L 23/5389* (2013.01); *H01L 28/10* (2013.01)

(58) Field of Classification Search
CPC ..................................................... H05K 1/165
See application file for complete search history.

(56) References Cited

U.S. PATENT DOCUMENTS

| | | | |
|---|---|---|---|
| 9,439,290 B1 * | 9/2016 | Lin ........................ | H05K 1/028 |
| 2004/0164835 A1 * | 8/2004 | Shoji ................... | H01F 17/0013 336/200 |
| 2010/0068864 A1 * | 3/2010 | Hopper ............... | H01L 23/5227 438/381 |
| 2010/0157565 A1 * | 6/2010 | Yoshida ................ | H01F 27/292 361/811 |
| 2018/0182532 A1 * | 6/2018 | Stahr ................... | H01F 17/0013 |
| 2019/0272936 A1 * | 9/2019 | Zhang ................. | H01F 41/0206 |
| 2019/0274217 A1 * | 9/2019 | Zhang ................... | H01F 41/041 |

* cited by examiner

*Primary Examiner* — Thao P Le
(74) *Attorney, Agent, or Firm* — Schwegman Lundberg & Woessner, P.A.

(57) ABSTRACT

An embedded magnetic inductor coil is at least partially exposed in a recess that seats an embedded multi-chip interconnect bridge die on the coil. The embedded multi-chip interconnect bridge die provides a communications bridge between a dominant semiconductive device and a first semiconductive device.

20 Claims, 8 Drawing Sheets

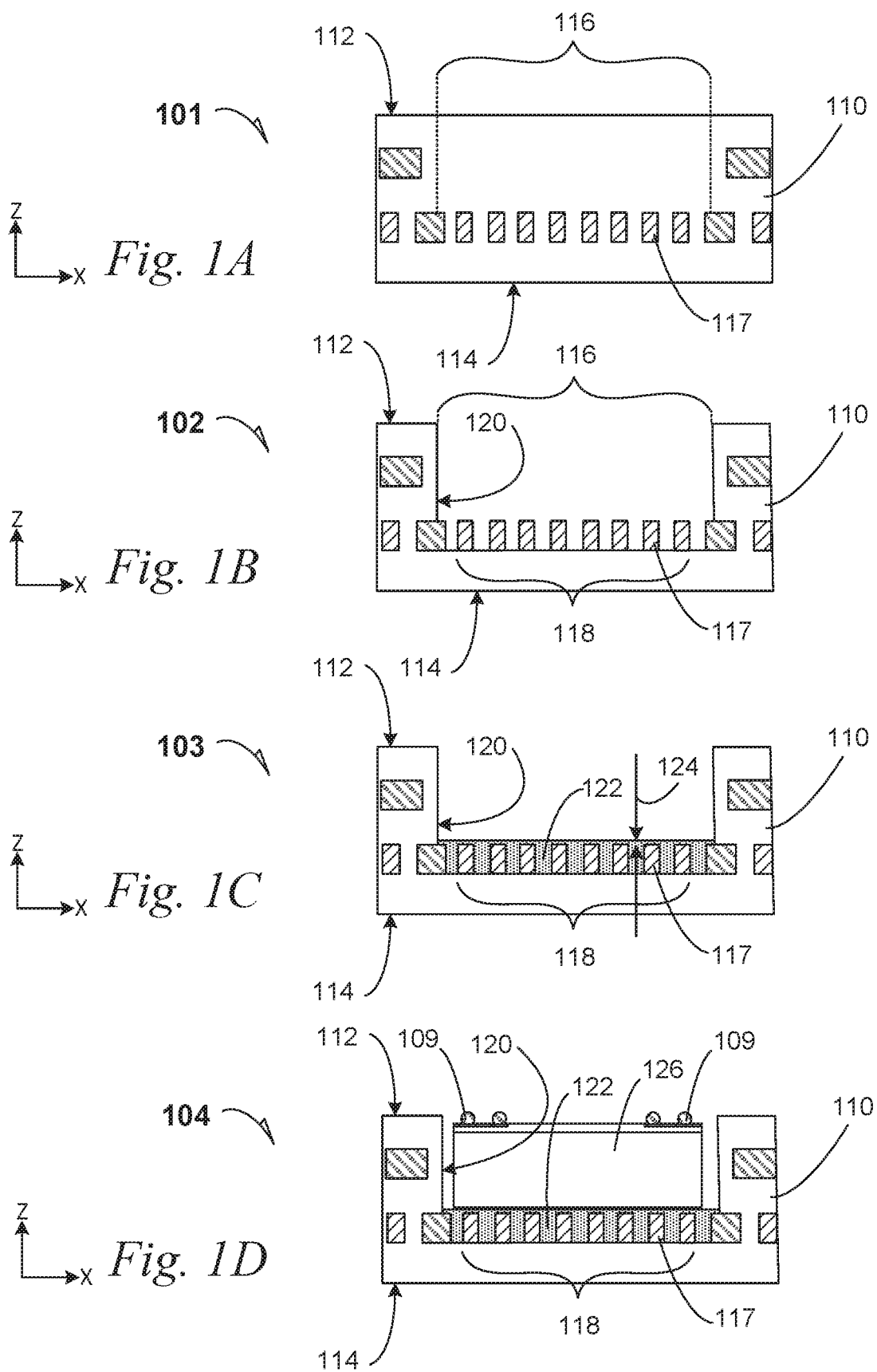

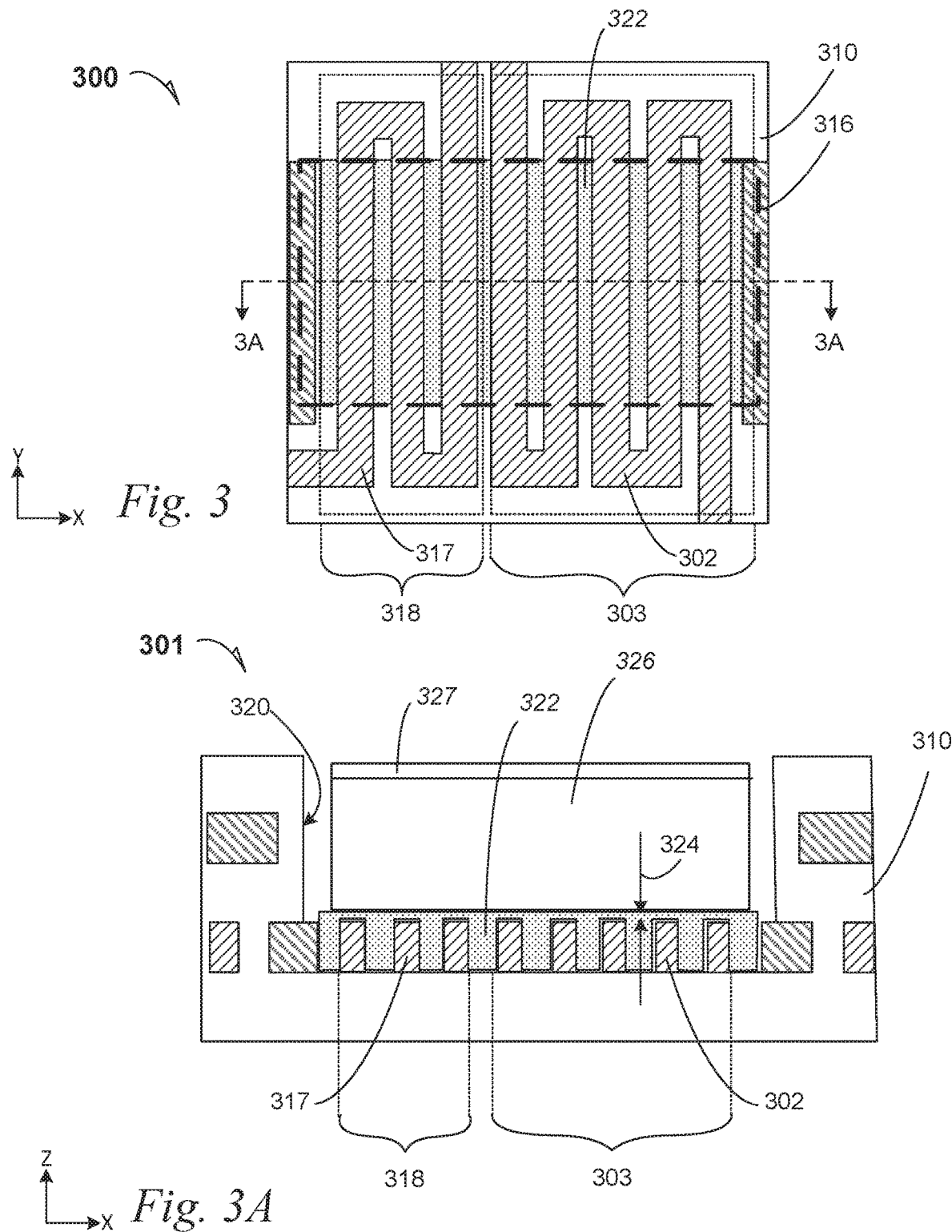

US 10,714,434 B1

INTEGRATED MAGNETIC INDUCTORS FOR EMBEDDED-MULTI-DIE INTERCONNECT BRIDGE SUBSTRATES

FIELD

This disclosure relates to inductors useful for power delivery for semiconductor device packages.

BACKGROUND

Semiconductive device miniaturization during packaging includes challenges to miniaturize power-delivery solutions. Inductors are one passive device that can be used.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of a portion of a semiconductor device package during processing of seating an embedded multi-die interconnect bridge according to an embodiment;

FIG. 1B is a cross-section elevation of the semiconductor device package depicted in FIG. 1A after further processing according to an embodiment;

FIG. 1C is a cross-section elevation of the semiconductor device package depicted in FIG. 1B after further processing according to an embodiment;

FIG. 1D is a cross-section elevation of the semiconductor device package depicted in FIG. 1C after further processing according to an embodiment;

FIGS. 2A and 2B are omitted;

FIG. 3 is a top cut-away plan of a portion of a semiconductor device package according to an embodiment;

FIG. 3A is a cross-section elevation of the semiconductor device package depicted in FIG. 3 according to an embodiment;

DETAILED DESCRIPTION

Figure 2C:
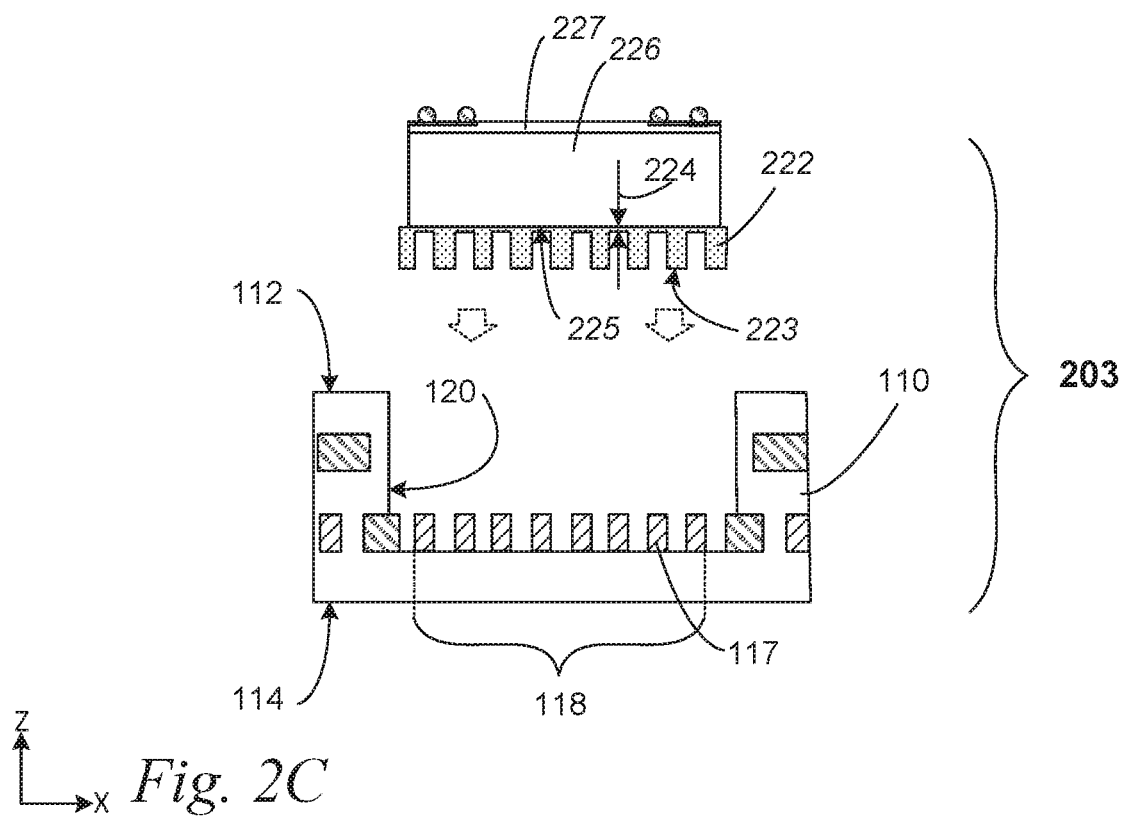
FIG. 2C is a cross-section elevation of the semiconductor device package depicted in FIG. 1B after further processing according to an embodiment.

Magnetic inductor embodiments, achieve permeability beyond unity that is experienced with air-core inductors. Disclosed embodiments are useful for constraining not only lateral (X-Y) size, but achieving lower-Z size with useful lines of magnetic inductivity.

Power-delivery solutions for semiconductor device packages that use embedded multi-die interconnect bridges (EMIBs), are disclosed where magnetic-core inductors are formed at least in part in the cavities made for the EMIBs.

FIG. 1A is a cross-section elevation of a portion of a semiconductor device package 101 during processing of seating an embedded multi-die interconnect bridge (EMIB) according to an embodiment. A semiconductor package substrate 110 includes a die side 112 and a land side 114, with an EMIB-cavity footprint 116 into which an EMIB is to be seated, and onto an inductor coil 118 to be further processed according to an embodiment.

FIG. 1B is a cross-section elevation of the semiconductor device package 101 depicted in FIG. 1A after further processing according to an embodiment. The semiconductor device package 102 has been processed by opening a recess 120 in the semiconductor package substrate 110. The recess 120 is formed to the size of the EMIB-cavity footprint 116 and to expose the inductor coil 118, one coil element 117 of which is indicated, and the entire coil cross-section 118 of which is indicated by the bracket 118.

During processing to open the recess 120, laser-drilling is used according to an embodiment. Where it is useful to only remove substrate material between coil elements 117, but not beneath, lasing is tuned to be dissipated in effectiveness at the level of the coil elements 117. In an embodiment, at least two laser beams are used when the level of the coil elements 117 is reached, such that only effective ablative lasing is achieved where the at least two laser-beam tips impinge upon the semiconductor package substrate 110 at the level of the coil elements 117.

FIG. 1C is a cross-section elevation of the semiconductor device package 102 depicted in FIG. 1B after further processing according to an embodiment. The semiconductor device package 103 has been processed by filling magnetic material 122 into the recess 120 of the semiconductor package substrate 110, and over the several elements of the inductor coil 118 according to an embodiment. The magnetic material 122 is illustrated filling interstices formed by the inductor coil 118.

In an embodiment, the magnetic material 122 is a ferrite material that is a dielectric. In an embodiment, the magnetic material 122 is an encapsulated material that is encapsulated by a dielectric. In an embodiment, the permeability of the inductor coil 118 is in a range from 1 to 1,000. In an embodiment, the permeability of the inductor coil 118 is in a range from 10 to 100.

In an embodiment, the magnetic material 122 is illustrated as both filling interstices formed by the inductor coil 118, and by forming a surplus 124 as a buffer between the coil elements 117 and an EMIB die to be seated in the recess 120. The surplus 124 therefore insulates the inductor coil 118 within the recess 120. In an embodiment, the region taking up the surplus 124 is substituted with an adhesive dielectric material 124, such that the inductor coil 118 is electrically insulated from the backside of an EMIB die (see, e.g. item 126 in FIG. 1D).

In an embodiment, magnetic ink 122 is printed between the several coil elements 117, and a surplus film 124 of the magnetic ink 122 extends in the Z-direction above each coil element 117 to form a dielectric barrier between the coil 118 and the back of the bridge die to be inserted.

In an embodiment, a package of magnetic material 122 is pressed over the coil 118 to fill between the coil elements 117, and a surplus 124 is also provided in the package of magnetic material 122. In an embodiment, a package of magnetic material 122 is pressed over the coil 118 to fill interstices between the coil elements 117, followed by the region taking up the surplus 124 is substituted with an adhesive dielectric material 124, such that the inductor coil 118 is electrically insulated from the backside of an EMIB die (see, e.g. item 126 in FIG. 1D).

FIG. 1D is a cross-section elevation of the semiconductor device package 103 depicted in FIG. 1C after further processing according to an embodiment. The semiconductor device package 104 has been processed by seating an EMIB die 126 into the recess 120 of the semiconductor package substrate 110. The EMIB die 126 adheres to the surplus 124 (see FIG. 1C) of the magnetic material 122, and is simultaneously electrically insulated from the coil 118. In an embodiment, an adhesive is first formed over the coil 118 such that upon formation of the magnetic material 122, the magnetic material 122 adheres to the coil 118.

In an embodiment to make a die set that uses the EMIB die 126, a first semiconductive device and a subsequent semiconductive device contact electrical contacts 109 such as the electrical bumps 109 depicted, such that the EMIB die 126 is a silicon communications bridge 126 between the first semiconductive device and the subsequent semiconductive device, while the inductor 118 and magnetic material 122 form a close-proximity magnetic inductor that is at least partially footprinted by the recess 120.

FIG. 2C is a cross-section elevation of the semiconductor device package 102 depicted in FIG. 1B after further processing according to an embodiment. FIGS. 2A and 2B are omitted. An EMIB die 226 includes an active surface and metallization 227 and a backside surface 225. The semiconductor package substrate 110 is prepared to receive the EMIB die 226, after forming a magnetic material 222 onto the EMIB die 226 backside surface 225, where the magnetic material 222 has a negative-space pattern compared to the positive-space pattern of the coil 118 that is exposed within the recess 120. Directional arrows indicate the insertion of the EMIB die 226 into the recess 120 and the movement when completed, forms an EMIB 226 seated above a magnetic-core inductor 118.

In an embodiment, a magnetic material surplus 224 is formed with the magnetic material 222 under conditions to adhere to the EMIB die 226 backside surface 225, and also under conditions to be adherent into the positive pattern of the coil 118 after insertion. In an example embodiment, an adhesive film 223 is applied to the undulating surface of the magnetic material 222. The adhesive film 223 provides sufficient low viscosity to allow insertion of the magnetic material 222 into the coil 118, and afterwards upon heating, fugitive plasticizers are driven out and the adhesive film 223 forms a bond with at least the coil 118 and optionally with exposed portions of the substrate 110 at the base of the recess 120.

Figure 2D:
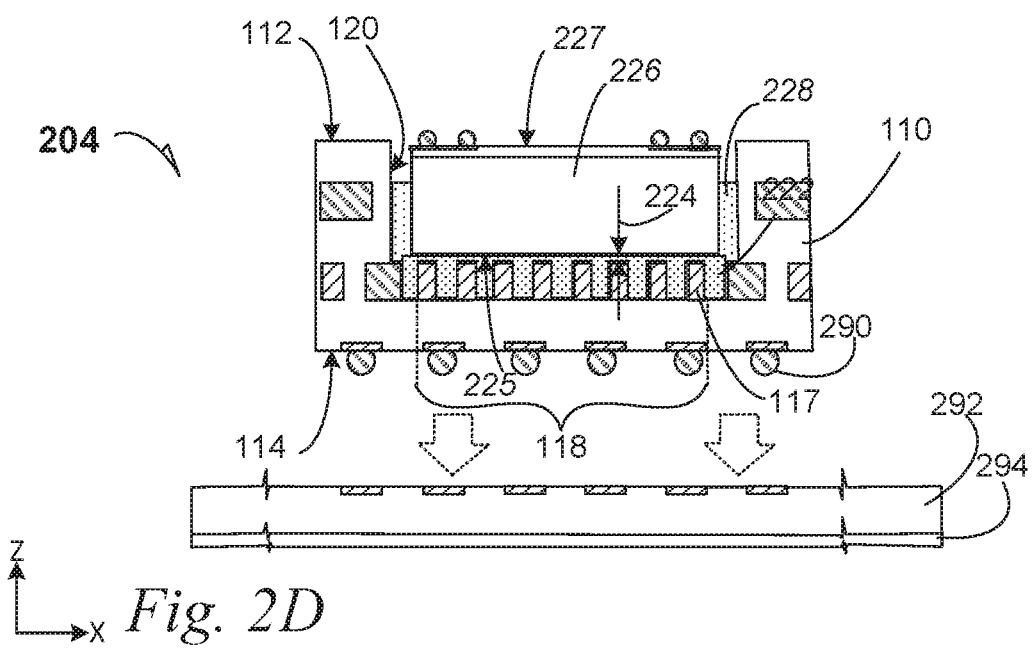
FIG. 2D is a cross-section elevation of the semiconductor device package depicted in FIG. 2C after further processing according to an embodiment

FIG. 2D is a cross-section elevation of the semiconductor device package 203 depicted in FIG. 2C after further processing according to an embodiment. The semiconductor device package 204 has been processed by seating the EMIB die 226 into the recess 120 of the semiconductor package substrate 110. The EMIB 226 adheres to the surplus 224 of the magnetic material 222, and the magnetic material 222 adheres to the coil 118.

In an embodiment, some indigenous adhesion occurs between the magnetic material 222, whether adhesive-assisted or not, and a recess fill material 228 is filled into the recess 120 after seating the magnetic material 222 and the EMIB die 226 into the recess 120, to form an EMIB 226.

In an embodiment after forming electrical bumps 290 on the land side 114, the semiconductor package substrate 110 is seated on a board 292 such as a motherboard 292. In an embodiment, the board 292 includes an external shell 204 that provides both physical and electrical insulation for devices within the external shell 294. In an embodiment, the board 292 holds a chipset (see FIG. 9).

Hereinafter and throughout this disclosure according to several embodiments, a semiconductor package substrate embodiment, with at least one embedded magnetic inductor embodiment, is assembled to a board such as the board 292 depicted in FIG. 2D.

FIG. 3 is a top cut-away plan of a portion of a semiconductor device package 300 according to an embodiment. An EMIB-cavity footprint 316 is superposed over a semiconductor package substrate 310, and the semiconductor package substrate 310 supports a first inductor coil 318 that includes several first-coil sections, one of which is indicated by reference number 317. In an embodiment, the EMIB-cavity footprint 316 also includes a subsequent inductor coil 303 that includes several subsequent-coil sections, one of which is indicated by reference number 302. In an embodiment, a single magnetic material 322 is interstitially located among the several coil elements including respective first and subsequent coil sections 318 and 303.

As illustrated in an embodiment, the layout of the first inductor coil 318, extends outside the EMIB-cavity footprint 316, such that during fabrication of the recess 320 (see FIG. 3A) portions of the first inductor coil 318 are exposed within the EMIB-cavity footprint 316. Similarly in an embodiment and as illustrated, the layout of the subsequent inductor coil 303, extends outside the EMIB-cavity footprint 316, such that during fabrication of the recess 320 (see FIG. 3A) portions of the subsequent inductor coil 303 are exposed within the EMIB-cavity footprint 316.

FIG. 3A is a cross-section elevation of the semiconductor device package 300 depicted in FIG. 3 along the section line 3A-3A according to an embodiment. Additionally, an EMIB die 326 is seated upon the magnetic material 322 at a surplus 324 that extends above the several coil sections 317 and 302 of the respective first inductor coil 318 and subsequent inductor coil 303. As illustrated in FIGS. 3 and 3A, the recess 320 at least partially footprints the inductor coils 318 and 303 and magnetic material 322.

Figure 4:
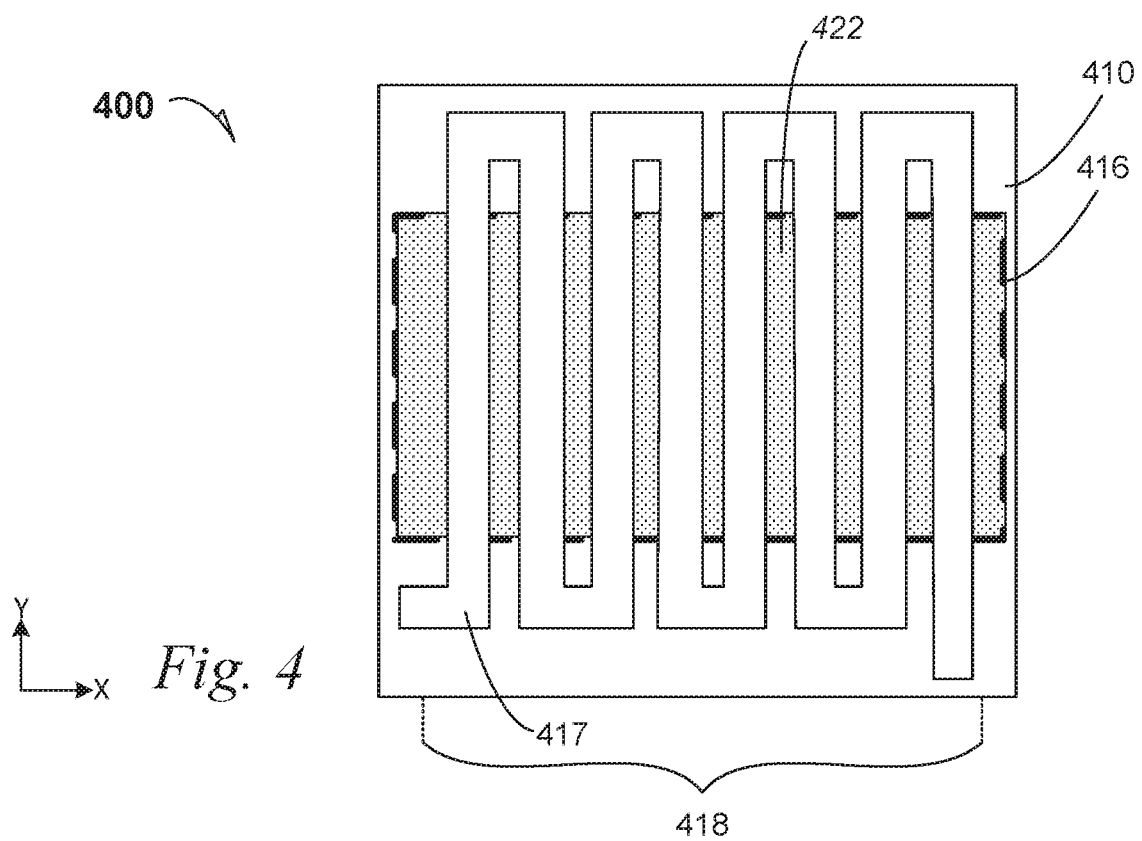
FIG. 4 is a top plan of a semiconductor device package with portions cut away to expose an inductor coil according to an embodiment.

FIG. 4 is a top plan of a semiconductor device package 400 with portions cut away to expose an inductor coil 418 according to an embodiment. An EMIB-cavity footprint 416 is superposed over a semiconductor package substrate 410, and the semiconductor package substrate 410 supports an inductor coil 418 that includes several coil sections, one of which is indicated by reference number 417. In an embodiment, a magnetic material 422 is interstitially located among the several coil elements 417.

As illustrated in an embodiment, the layout of the inductor coil 418, extends outside the EMIB-cavity footprint 416, such that during fabrication of the recess defined by the EMIB-cavity footprint 416 to expose portions of the inductor coil 418 within the EMIB-cavity footprint 416. As illustrated, a single, serpentine coil form factor is configured across the EMIB-cavity footprint 416 according to an embodiment.

Figure 5:
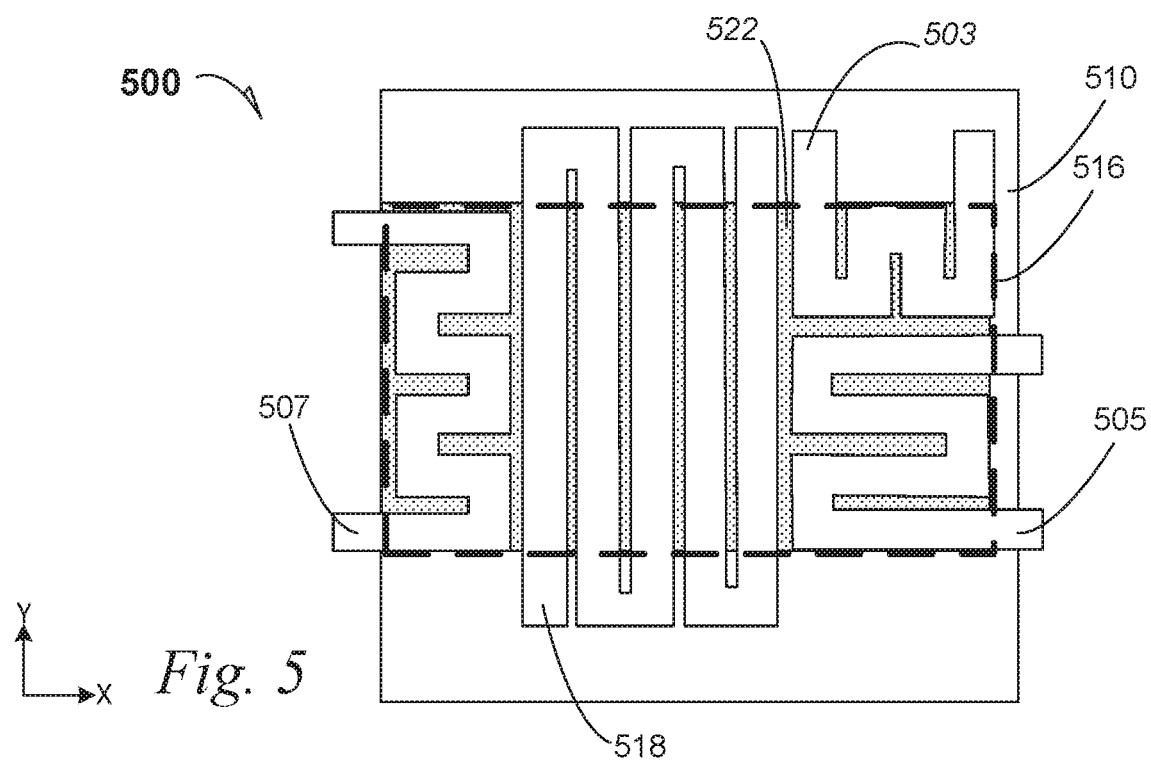
FIG. 5 is a top plan of a semiconductor device package with portions cut away to expose several inductor coils according to an embodiment.

FIG. 5 is a top plan of a semiconductor device package 500 with portions cut away to expose several inductor coils according to an embodiment. An EMIB-cavity footprint 516 is superposed over a semiconductor package substrate 510, and the semiconductor package substrate 510 supports four inductor coils, which are indicated by a reference numbers 503, 507, 509 and 518 leading to coil sections of respective first 518, subsequent 503, third 505 and fourth 507 coils. In an embodiment, a magnetic material 522 is interstitially located among the several coil sections and interstitially among coil elements of the coil sections.

The first inductor coil 518 traverses more than the entire EMIB-cavity footprint 516 across the Y-direction, but less than half way across the X-direction, and it has four turns. The subsequent inductor coil 503 traverses a minor amount of the footprint in both X and Y directions, and it has three turns. The third inductor coil 505 traverses a major portion of the footprint in the Y-direction but a minor portion in the X-direction. The fourth inductor coil 507 traverses essentially the entire portion of the footprint in the Y-direction, but a minor portion in the X-direction, and it has five turns. As discussed, a given inductor coil can be qualified as e.g. a serpentine coil, and quantified by number of turns, coil trace thickness relative to e.g. the EMIB-cavity footprint form factor, and the extent it traverses the EMIB-cavity footprint, among other properties.

In an embodiment, one inductor coil, e.g. 503 or 518 has a serpentine form factor that runs along a Y-direction, and one inductor coil, e.g. 505 or 507 has a serpentine form factor orthogonal to the first serpentine form factor.

Figure 6:
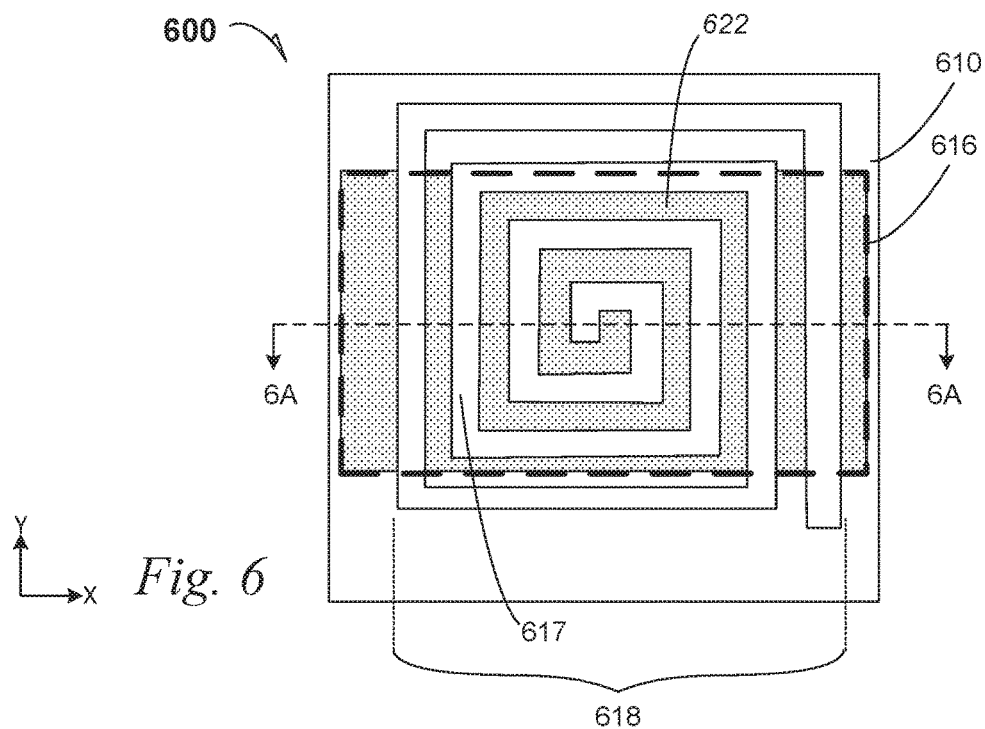
FIG. 6 is a top cut-away plan of a portion of a semiconductor device package according to an embodiment.

FIG. 6 is a top cut-away plan of a portion of a semiconductor device package 600 according to an embodiment. An EMIB-cavity footprint 616 is superposed over a semiconductor package substrate 610, and the semiconductor package substrate 610 supports a spiral inductor coil 618 that includes several first-coil elements, one of which is indicated by reference number 617.

As illustrated and in an embodiment, the layout of the spiral inductor coil 618, extends outside the EMIB-cavity footprint 616, such that during fabrication of the recess 620 (see FIG. 6A), portions of the spiral inductor coil 618 are exposed within the EMIB-cavity footprint 616.

Figure 6A:
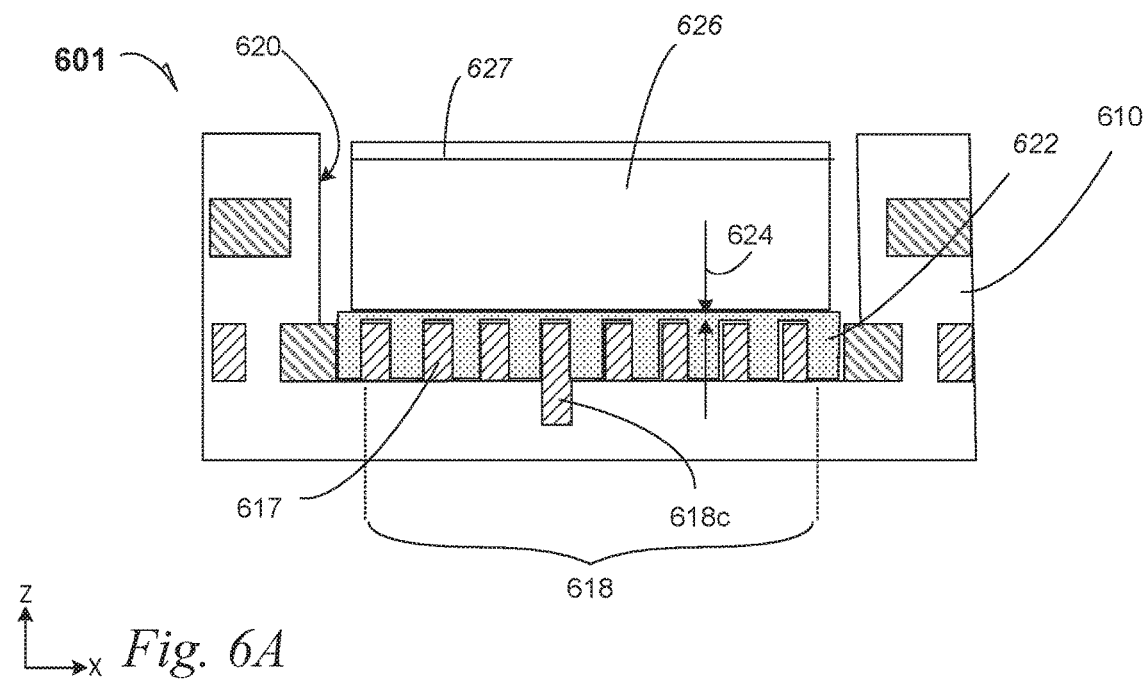
FIG. 6A is a cross-section elevation of the semiconductor device package depicted in FIG. 6 according to an embodiment.

FIG. 6A is a cross-section elevation of the semiconductor device package 600 depicted in FIG. 6 along the section line 6A-6A according to an embodiment. Additionally, an EMIB die 626 is seated upon the magnetic material 622 at a surplus 624 that extends above the several coil elements 617 of the spiral inductor coil 618. Electrical communication is achieved in part by extending or coupling the center coil section 618c to a level below (Z-direction) where the spiral inductor coil 618 is formed. The spiral inductor coil 618 can be characterized many ways, one of which is the number of turns, which appears to be at least 5 turns. In an embodiment, the spiral inductor coil 618 has two turns. In an embodiment, the spiral inductor coil 618 has 20 turns. In an embodiment, the spiral inductor coil 618 has a range from two turns to 20 turns.

It may now be understood that a spiral form-factor inductor coil, such as the inductor coil 618 depicted in FIGS. 6 and 6A, may be added to a multiple inductor coil assembly such as inductor coil 505 in FIG. 5, is replaced by a spiral inductor coil with sizing and overall turns that fit the ersatz space vacated by the inductor coil 505. In an example embodiment, a spiral inductor coil has two complete turns in the ersatz space vacated by the inductor coil 505. In an embodiment, a spiral inductor coil assembly replaces the serpentine inductor coils 518 and 507.

Figure 7:
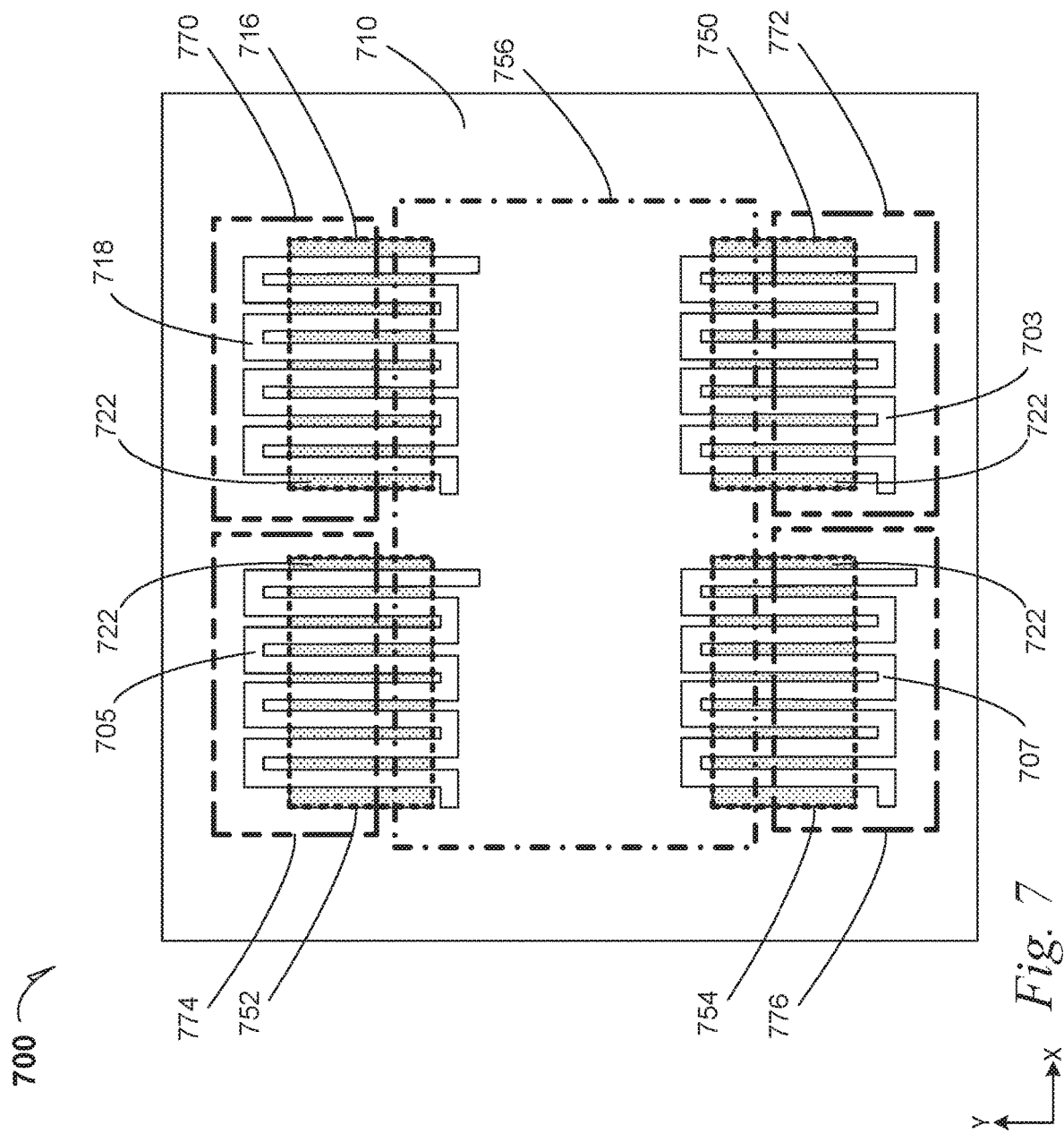
FIG. 7 is a top cut-away plan of a semiconductor device package according to an embodiment.

FIG. 7 is a top cut-away plan of a semiconductor device package 700 according to an embodiment. Four EMIB-cavity footprints 716, 750, 752 and 754 are is superposed over a semiconductor package substrate 710. In an embodiment, a dominant semiconductive device is to be seated on a dominant-device footprint 756 at a die side (analogous to the die side 112 in FIG. 1A) of the semiconductor package substrate 710. The die side is not indicated in FIG. 7 because of the cut-away depiction.

The term "dominant semiconductive device" is used in an embodiment ordinally to distinguish from, e.g., a first semiconductive device that occupies the footprint 770 and a subsequent semiconductive device that occupies the footprint 772.

In an embodiment, the dominant semiconductive device that occupies the footprint 756 has master-slave relationships to e.g., the first semiconductive device that occupies the footprint 770 and the subsequent semiconductive device that occupies the footprint 772. In an embodiment, the dominant semiconductive device that occupies the footprint 756 has a multiple-EMIB-die connection and e.g., the first semiconductive device that occupies the footprint 770 and the subsequent semiconductive that occupies the footprint 772, each only having a single-EMIB-die connection.

In an embodiment, four EMIB-die-connected dice are to contact EMIB dice that take up respective EMIB-die-connected footprints including a first EMIB-connected-die at the footprint 770, a subsequent EMIB-connected-die at the footprint 772, a third EMIB-connected-die at the footprint 774 and a fourth EMIB-connected-die at the footprint 776.

As illustrated by way of non-limiting example embodiment, a single serpentine-style inductor coil 718 is embedded in the semiconductor package substrate 710 and partially exposed through the recess that is delineated by a first EMIB-cavity footprint 716, and magnetic material 722 fills the interstices of the inductor coil 718. Similarly, each of the subsequent, third and fourth EMIB-cavity footprints 750, 752 and 754 exposes embedded and partially exposed serpentine-style inductor coils 703, 705 and 707, as well as magnetic material 722.

In an embodiment, the first inductor coil 718 is replaced by the inductor coils 318 and 303 depicted in FIG. 3A, and the remaining inductor coils 703, 705 and 707 have the serpentine form factor depicted in FIG. 7. In an embodiment, any two of the inductor coils, such as the first and subsequent inductor coils 718 and 703, are each replaced by the inductor coils 318 and 303 depicted in FIG. 3A, and the remaining inductor coils 705 and 707 have the serpentine form factor depicted in FIG. 7. In an embodiment, any three of the inductor coils, such as the first, subsequent and third inductor coils 718, 703 and 705, are each replaced by the inductor coils 318 and 303 depicted in FIG. 3A, and the remaining inductor coil 707 has the serpentine form factor depicted in FIG. 7. In an embodiment, all four inductor coils are replaced by inductor coils 318 and 303.

In an embodiment, the first inductor coil 718 is replaced by the inductor coils 518, 503, 505 and 507 depicted in FIG. 5, and the remaining inductor coils 703, 705 and 707 have the serpentine form factor depicted in FIG. 7. In an embodiment, any two of the inductor coils, such as the first and subsequent inductor coils 718 and 703, are each replaced by the inductor coils 518, 503, 505 and 507 depicted in FIG. 5, and the remaining inductor coils 705 and 707 have the serpentine form factor depicted in FIG. 7. In an embodiment, any three of the inductor coils, such as the first, subsequent and third inductor coils 718, 703 and 705, are each replaced by the inductor coils 518, 503, 505 and 507 depicted in FIG. 5, and, and the remaining inductor coil 707 has the serpentine form factor depicted in FIG. 7. In an embodiment, each of the four inductor coils are replaced by exemplars of the inductor coils 518, 503, 505 and 507.

In an embodiment, the first inductor coil 718 is replaced by the inductor coil 618 depicted in FIG. 6, and the remaining inductor coils 703, 705 and 707 have the serpentine form factor depicted in FIG. 7. In an embodiment, any two of the inductor coils, such as the first and subsequent inductor coils 718 and 703, are each replaced by the inductor coil 618 depicted in FIG. 6, and the remaining inductor coils 705 and 707 have the serpentine form factor depicted in FIG. 7. In an embodiment, any three of the inductor coils, such as the first, subsequent and third inductor coils 718, 703 and 705, are each replaced by the inductor coil 618 depicted in FIG. 6, and, and the remaining inductor coil 707 has the serpentine form factor depicted in FIG. 7. In an embodiment, each of the four inductor coils are replaced by exemplars of the inductor coil 618.

It may now be appreciated that different inductor coil embodiments may be assembled into the semiconductor package substrate 710, such as the depicted first inductor coil 718, the subsequent inductor coil 703 is replaced by the inductor coil exemplars 318 and 303, the third inductor coil 705 is replaced by the inductor coil exemplars 518, 503, 505 and 507, and the fourth inductor coil 707 is replaced by the inductor coil exemplar 618 according to an embodiment.

In an embodiment, the dominant semiconductor device to be seated at the dominant-device footprint 756, is a central processing unit (CPU) semiconductive device. In an embodiment, the dominant semiconductive device to be seated at the dominant-device footprint 756, is an input/output (I/O) semiconductive device.

In an embodiment, at least one of the semiconductive devices that take up the EMIB-connected-die footprints 770, 772, 774 and 776, is a CPU, the semiconductive device to be seated at the dominant-device footprint 756 is an I/O semiconductive device, and at least one other of the semiconductive devices that take up the EMIB-connected-die footprints 770, 772, 774 and 776, is a memory die such as a non-volatile memory die.

In an embodiment, the dominant semiconductive device to be seated at the dominant-device footprint 756, is a CPU semiconductive device, at least one of the semiconductive devices that take up the EMIB-connected-die footprints 770, 772, 774 and 776, is a is a platform-controller hub (PCH) semiconductive device, at least one other of the semiconductive devices that take up the EMIB-connected-die footprints 770, 772, 774 and 776, is a memory die such as a non-volatile memory die, and at least one other of the semiconductive devices that take up the EMIB-connected-die footprints 770, 772, 774 and 776, is a baseband processor die.

In an embodiment, the dominant semiconductive device to be seated at the dominant-device footprint 756, is a CPU semiconductive device and least one of the semiconductive devices that take up the EMIB-connected-die footprints 770, 772, 774 and 776, is a is a platform-controller hub semiconductive device, one other of the semiconductive devices that take up the EMIB-connected-die footprints 770, 772, 774 and 776, is a memory die such as a non-volatile memory die, one other of the semiconductive devices that take up the EMIB-connected-die footprints 770, 772, 774 and 776, is a baseband processor die, and the fourth of the other of the semiconductive devices that take up the EMIB-connected-die footprints 770, 772, 774 and 776, is a graphics processor unit (GPU).

In an embodiment, where each of the several die footprints are depicted as dashed lines, each of the several die footprints represent actual semiconductive devices as described with respect to FIG. 7. Accordingly, a dominant die 756 is a first semiconductive device, and an EMIB-connected die 770 is a subsequent semiconductive device according to a non-limiting embodiment. Further, a third semiconductive device 774 and a fourth semiconductive device 776 are singly or together part of a chipset that includes the dominant die 756, the first die 770 and the subsequent die 772.

In an embodiment, no die is dominant, and the "dominant die" 756 is merely a placeholder term for one die among many, where all dice, e.g., 756, 770, 772 and 774 are equally important and divide computational function equally. In an embodiment, all dice are equal in size and shape, compared to as illustrated in FIG. 7. In an embodiment, all dice encompass tiling architectures, where the processing system is composed of tiles dice that can have the same or different functionality i.e. CPU core-tiles, GPU-tiles, IO-tiles, memory-hub tiles and so on.

Consequently, the "dominant die 756" is a placeholder designation that is geographically located among at least one of the first die 770 and the subsequent die 772, where dice share computational duty with no having a master relationship to any other die. In an embodiment, the "dominant die 756" is a placeholder designation that is geographically located among at least two of the first die 770, the subsequent die 772 and the third die 774, where dice share computational duty with no having a master relationship to any other die. In an embodiment, the "dominant die 756" is a placeholder designation that is geographically located among at least three of the first die 770, the subsequent die 772, the third die 774 and the fourth die 776, where dice share computational duty with no having a master relationship to any other die.

Figure 8:
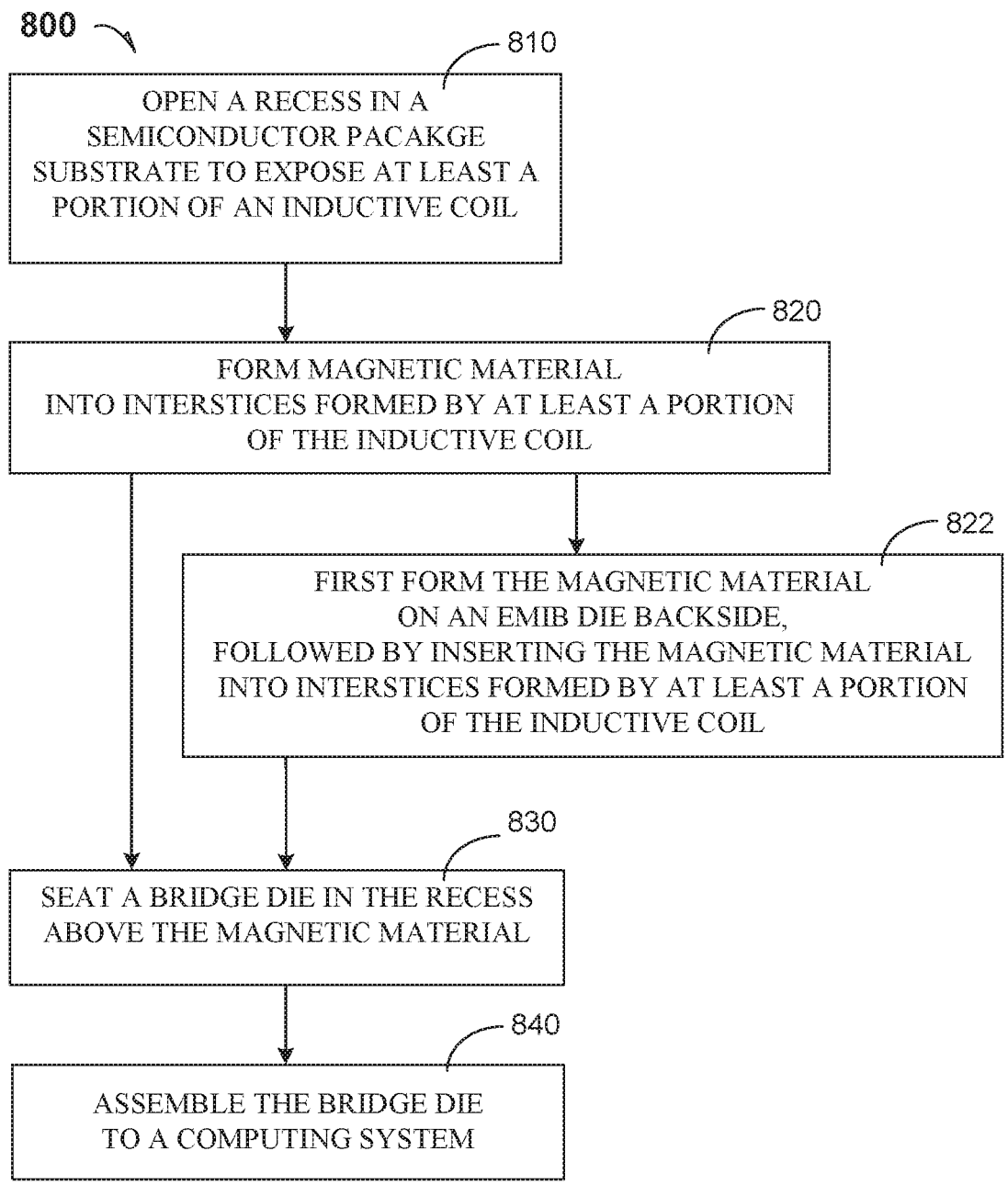
FIG. 8 is a process flow diagram according to an embodiment.

FIG. 8 is a process flow diagram 800 according to an embodiment.

At 810, the process includes opening a recess in a package substrate to expose at least a portion of an inductor coil.

At 820, the process includes filling magnetic material into interstices formed by the inductor coil.

At 830, the process includes seating a bridge die in the recess above the magnetic material.

At 840, the process includes assembling the embedded magnetic inductor and EMIB die to a computing system.

Figure 9:
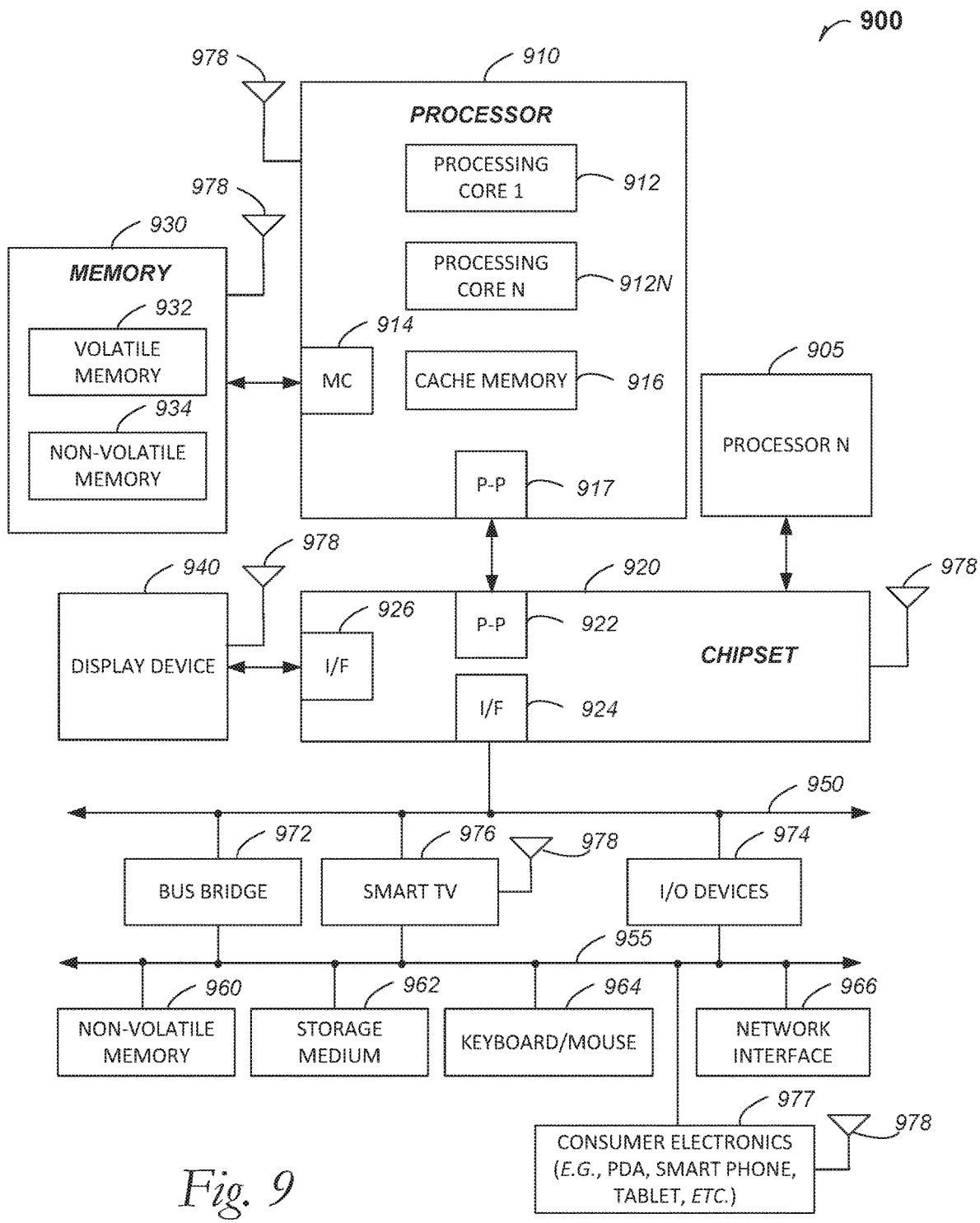
FIG. 9 is included to show an example of a higher-level device application for the disclosed embodiments.

FIG. 9 is included to show an example of a higher-level device application for the disclosed embodiments. The embedded magnetic inductor and EMIB die embodiments may be found in several parts of a computing system. In an embodiment, the embedded magnetic inductor and EMIB die is part of a communications apparatus such as is affixed to a cellular communications tower. In an embodiment, a computing system 900 includes, but is not limited to, a desktop computer. In an embodiment, a system 900 includes, but is not limited to a laptop computer. In an embodiment, a system 900 includes, but is not limited to a netbook. In an embodiment, a system 900 includes, but is not limited to a tablet. In an embodiment, a system 900 includes, but is not limited to a notebook computer. In an embodiment, a system 900 includes, but is not limited to a personal digital assistant (PDA). In an embodiment, a system 900 includes, but is not limited to a server. In an embodiment, a system 900 includes, but is not limited to a workstation. In an embodiment, a system 900 includes, but is not limited to a cellular telephone. In an embodiment, a system 900 includes, but is not limited to a mobile computing device. In an embodiment, a system 900 includes, but is not limited to a smart phone. In an embodiment, a system 900 includes, but is not limited to an internet appliance. Other types of computing devices may be configured with the microelectronic device that includes embedded magnetic inductor and EMIB die embodiments.

In an embodiment, the processor 910 has one or more processing cores 912 and 912N, where 912N represents the Nth processor core inside processor 910 where N is a positive integer. In an embodiment, the electronic device system 900 using an embedded magnetic inductor and EMIB die embodiment that includes multiple processors including 910 and 905, where the processor 905 has logic similar or identical to the logic of the processor 910. In an embodiment, the processing core 912 includes, but is not limited to, pre-fetch logic to fetch instructions, decode logic to decode the instructions, execution logic to execute instructions and the like. In an embodiment, the processor 910 has a cache memory 916 to cache at least one of instructions and data for the embedded magnetic inductor and EMIB die in the system 900. The cache memory 916 may be organized into a hierarchal structure including one or more levels of cache memory.

In an embodiment, the processor 910 includes a memory controller 914, which is operable to perform functions that enable the processor 910 to access and communicate with memory 930 that includes at least one of a volatile memory 932 and a non-volatile memory 934. In an embodiment, the processor 910 is coupled with memory 930 and chipset 920. In an embodiment, the chipset 920 is part of a system-in-package with an embedded magnetic inductor and EMIB die depicted in FIG. 1E. The processor 910 may also be coupled to a wireless antenna 978 to communicate with any device configured to at least one of transmit and receive wireless signals. In an embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 934 includes, but is not limited to, flash memory, phase change memory (PCM), read-only memory (ROM), electrically erasable programmable read-only memory (EEPROM), or any other type of non-volatile memory device.

The memory 930 stores information and instructions to be executed by the processor 910. In an embodiment, the memory 930 may also store temporary variables or other intermediate information while the processor 910 is executing instructions. In the illustrated embodiment, the chipset 920 connects with processor 910 via Point-to-Point (PtP or P-P) interfaces 917 and 922. Either of these PtP embodiments may be achieved using an embedded magnetic inductor and EMIB die embodiment as set forth in this disclosure. The chipset 920 enables the processor 910 to connect to other elements in an embedded magnetic inductor and EMIB die embodiment in a system 900. In an embodiment, interfaces 917 and 922 operate in accordance with a PtP communication protocol such as the Intel® QuickPath Interconnect (QPI) or the like. In other embodiments, a different interconnect may be used.

In an embodiment, the chipset 920 is operable to communicate with the processor 910, 905N, the display device 940, and other devices 972, 976, 974, 960, 962, 964, 966, 977, etc. The chipset 920 may also be coupled to a wireless antenna 978 to communicate with any device configured to at least do one of transmit and receive wireless signals.

The chipset 920 connects to the display device 940 via the interface 926. The display 940 may be, for example, a liquid crystal display (LCD), a plasma display, cathode ray tube (CRT) display, or any other form of visual display device. In an embodiment, the processor 910 and the chipset 920 are merged into an embedded magnetic inductor and EMIB die in a computing system. Additionally, the chipset 920 connects to one or more buses 950 and 955 that interconnect various elements 974, 960, 962, 964, and 966. Buses 950 and 955 may be interconnected together via a bus bridge 972 such as at least one embedded magnetic inductor and EMIB die apparatus embodiment. In an embodiment, the chipset 920, via interface 924, couples with a non-volatile memory 960, a mass storage device(s) 962, a keyboard/mouse 964, a network interface 966, smart TV 976, and the consumer electronics 977, etc.

In an embodiment, the mass storage device 962 includes, but is not limited to, a solid state drive, a hard disk drive, a universal serial bus flash memory drive, or any other form of computer data storage medium. In one embodiment, the network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the embedded magnetic inductor and EMIB die embodiment in a computing system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into the processor core 912.

Where useful, the computing system 900 may have a broadcasting structure interface such as for affixing the apparatus to a cellular tower.

To illustrate the embedded magnetic inductor and EMIB die embodiments and methods disclosed herein, a non-limiting list of examples is provided herein:

Example 1 is a semiconductor device package, comprising: an inductor coil in a semiconductor package substrate; a magnetic material in interstices of the inductor coil; and a recess that projects a footprint onto at least a portion of the inductor coil.

In Example 2, the subject matter of Example 1 optionally includes wherein the magnetic material includes a surplus in the recess that insulates the inductor coil.

In Example 3, the subject matter of any one or more of Examples 1-2 optionally include an adhesive dielectric material in the recess that insulates the inductor coil.

In Example 4, the subject matter of any one or more of Examples 1-3 optionally include an embedded multi-die interconnect bridge (EMIB) die in the recess.

In Example 5, the subject matter of any one or more of Examples 1-4 optionally include an embedded multi-die interconnect bridge (EMIB) die in the recess; and a recess fill material in the recess that contacts the recess and the EMIB die.

In Example 6, the subject matter of any one or more of Examples 1-5 optionally include an embedded multi-die interconnect bridge (EMIB) die in the recess, wherein the magnetic material contacts the EMIB die with a surplus of the magnetic material, between the EMIB die and the inductor coil.

In Example 7, the subject matter of any one or more of Examples 1-6 optionally include an embedded multi-die interconnect bridge (EMIB) die in the recess, wherein an adhesive dielectric contacts the inductor coil and the EMIB die at a backside of the EMIB die.

In Example 8, the subject matter of any one or more of Examples 1-7 optionally include wherein the inductor coil is a first inductor coil, further including a subsequent inductor coil in the semiconductor package substrate, wherein the magnetic material is in interstices of the subsequent inductor coil, and wherein the recess projects the footprint onto at least a portion of the subsequent inductor coil.

In Example 9, the subject matter of any one or more of Examples 1-8 optionally include: wherein the inductor coil is a first inductor coil; a subsequent inductor coil in the semiconductor package substrate; wherein the magnetic material is in interstices of the subsequent inductor coil; wherein the recess projects the footprint onto at least a portion of the subsequent inductor coil; and wherein the first inductor coil has a serpentine form factor, and wherein the subsequent inductor coil has a serpentine form factor.

In Example 10, the subject matter of any one or more of Examples 1-9 optionally include: wherein the inductor coil is a first inductor coil with a serpentine form factor of a first orientation; a subsequent inductor coil in the semiconductor package substrate; wherein the magnetic material is in interstices of the subsequent inductor coil; wherein the recess projects the footprint onto at least a portion of the subsequent inductor coil; and wherein the subsequent inductor coil has a serpentine form factor that is orthogonal to the subsequent inductor coil form factor.

In Example 11, the subject matter of any one or more of Examples 1-10 optionally include wherein the inductor coil is a spiral inductor coil.

In Example 12, the subject matter of any one or more of Examples 1-11 optionally include: wherein the inductor coil is a first inductor coil with a serpentine form factor of a first orientation; a subsequent inductor coil in the semiconductor package substrate; wherein the magnetic material is in interstices of the subsequent inductor coil; wherein the recess projects the footprint onto at least a portion of the subsequent inductor coil; and wherein the subsequent inductor coil has a spiral form factor.

In Example 13, the subject matter of any one or more of Examples 1-12 optionally include an embedded multi-die interconnect bridge die in the recess; a dominant die on a die side of the semiconductor package substrate and contacting the embedded multi-die interconnect bridge die; a first die on the die side of the semiconductor package substrate and contacting the embedded multi-die interconnect bridge; and a board on the semiconductor device substrate at a land side opposite the die side.

In Example 14, the subject matter of any one or more of Examples 1-13 optionally include an embedded multi-die interconnect bridge die in the recess; a dominant die on a die side of the semiconductor package substrate and contacting the embedded multi-die interconnect bridge die; a first die on the die side of the semiconductor package substrate and contacting the embedded multi-die interconnect bridge; a board on the semiconductor device substrate at a land side opposite the die side; and.

In Example 15, the subject matter of any one or more of Examples 1-14 optionally include an embedded multi-die interconnect bridge die in the recess; a dominant die on a die side of the semiconductor package substrate and contacting the embedded multi-die interconnect bridge die; a first die on the die side of the semiconductor package substrate and contacting the embedded multi-die interconnect bridge; a board on the semiconductor device substrate at a land side opposite the die side, and wherein the semiconductive device is part of a chipset.

In Example 16, the subject matter of any one or more of Examples 1-15 optionally include an embedded multi-die interconnect bridge die in the recess; a dominant die on a die side of the semiconductor package substrate and contacting the embedded multi-die interconnect bridge die; a first die on the die side of the semiconductor package substrate and contacting the embedded multi-die interconnect bridge; and wherein the dominant die is a placeholder die geographically located among the first die and a board on the semiconductor device substrate at a land side opposite the die side, and wherein the semiconductive device is part of a chipset.

Example 17 is a semiconductor device package, comprising: a semiconductor package substrate including a die side and a land side, with a first recess and a subsequent recess; a first inductor coil in the semiconductor package substrate and the first recess, wherein the first recess projects a first footprint onto at least part of the first inductor coil; a first magnetic material in interstices of the first inductor coil; a first EMIB die in the first recess, above the first inductor coil; a subsequent inductor coil in the semiconductor package substrate and the subsequent recess, wherein the subsequent recess projects a subsequent footprint onto at least part of the subsequent inductor coil; a subsequent magnetic material in interstices of the subsequent inductor coil; a subsequent EMIB die in the subsequent recess, above the subsequent inductor coil; a dominant semiconductive device above the die side and in contact with the first EMIB die and the subsequent EMIB die; a first semiconductive device above the die side and in contact with the first EMIB die; and a subsequent semiconductive device above the die side and in contact with the subsequent EMIB die.

In Example 18, the subject matter of Example 17 optionally includes a third recess in the semiconductor package substrate; a third inductor coil in the semiconductor package substrate and the third recess, wherein the third recess projects a third footprint onto at least part of the third inductor coil; a third magnetic material in interstices of the subsequent inductor coil; a third EMIB die in the third recess, above the third inductor coil; and wherein the dominant semiconductive device is in contact with the third EMIB die.

In Example 19, the subject matter of any one or more of Examples 17-18 optionally include a third recess in the semiconductor package substrate; a third inductor coil in the semiconductor package substrate and the third recess, wherein the third recess projects a third footprint onto at least part of the third inductor coil; a third magnetic material in interstices of the third inductor coil; a third EMIB die in the third recess, above the third inductor coil; a fourth recess in the semiconductor package substrate; a fourth inductor coil in the semiconductor package substrate and the fourth recess, wherein the fourth recess projects a fourth footprint onto at least part of the fourth inductor coil; a fourth magnetic material in interstices of the fourth inductor coil; a fourth EMIB die in the fourth recess, above the fourth inductor coil; wherein the dominant semiconductive device is in contact with the third and fourth EMIB dice; a third second semiconductive device above the die side and in contact with the third EMIB die; and a fourth semiconductive device above the die side and in contact with the fourth EMIB die.

In Example 20, the subject matter of any one or more of Examples 17-19 optionally include wherein the first inductor coil has a serpentine form factor, and wherein the subsequent inductor coil has a serpentine form factor.

In Example 21, the subject matter of any one or more of Examples 17-20 optionally include wherein the first inductor coil has a serpentine form factor, and wherein the subsequent inductor coil has a spiral form factor.

Example 22 is a process of forming a magnetic core inductor, comprising: exposing at least part of an inductor coil in a recess in a semiconductor package substrate; filling magnetic material into interstices in the inductor coil; and electrically insulating the inductor coil at exposed portions of the inductor coil.

In Example 23, the subject matter of Example 22 optionally includes seating a bridge die in the recess above the inductor coil and magnetic material; and connecting a dominant semiconductive device to the bridge die; and connecting a first semiconductive device to the bridge die, to couple the dominant semiconductive device to the first semiconductive device through the bridge die.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor device package, comprising:
    an inductor coil in a semiconductor package substrate;
    a magnetic material in interstices of the inductor coil;
    a recess that projects a footprint onto at least a portion of the inductor coil; and
    an embedded multi-die interconnect bridge (EMIB) die in the recess.

2. The semiconductor package substrate of claim 1, further including wherein the magnetic material includes a surplus in the recess that insulates the inductor coil.

3. The semiconductor package substrate of claim 1, further including an adhesive dielectric material in the recess that insulates the inductor coil.

4. The semiconductor device package of claim 1, further including a recess fill material in the recess that contacts the recess and the EMIB die.

5. The semiconductor device package of claim 1, further including wherein the magnetic material contacts the EMIB die with a surplus of the magnetic material, between the EMIB die and the inductor coil.

6. The semiconductor device package of claim 1, further including wherein an adhesive dielectric contacts the inductor coil and the EMIB die at a backside of the EMIB die.

7. A semiconductor device package, comprising:
    an inductor coil in a semiconductor package substrate;
    a magnetic material in interstices of the inductor coil;
    a recess that projects a footprint onto at least a portion of the inductor coil;
    wherein the inductor coil is a first inductor coil;
    a subsequent inductor coil in the semiconductor package substrate;

wherein the magnetic material is in interstices of the subsequent inductor coil;
wherein the recess projects the footprint onto at least a portion of the subsequent inductor coil; and
wherein the first inductor coil has a serpentine form factor, and wherein the subsequent inductor coil has a serpentine form factor.

8. The semiconductor device package of claim 7:
wherein the first inductor coil has a serpentine form factor of a first orientation; and
wherein the subsequent inductor coil has a serpentine form factor that is orthogonal to the subsequent inductor coil form factor.

9. The semiconductor device package of claim 7:
wherein the first inductor coil has a serpentine form factor of a first orientation; and
wherein the subsequent inductor coil has a spiral form factor.

10. A semiconductor device package, comprising:
an inductor coil in a semiconductor package substrate;
a magnetic material in interstices of the inductor coil;
a recess that projects a footprint onto at least a portion of the inductor coil; wherein the inductor coil is a spiral inductor coil.

11. A semiconductor device package, comprising:
an inductor coil in a semiconductor package substrate;
a magnetic material in interstices of the inductor coil;
a recess that projects a footprint onto at least a portion of the inductor coil;
an embedded multi-die interconnect bridge die in the recess;
a dominant die on a die side of the semiconductor package substrate and contacting the embedded multi-die interconnect bridge die;
a first die on the die side of the semiconductor package substrate and contacting the embedded multi-die interconnect bridge; and
a board on the semiconductor device substrate at a land side opposite the die side.

12. The semiconductor device package of claim 11, further including
an external shell on the board, wherein the external shell is a dielectric material.

13. The semiconductor device package of claim 11, further including
wherein the semiconductive device is part of a chipset.

14. The semiconductor device package of claim 11, further including
wherein the semiconductive device is part of a chipset.

15. A semiconductor device package, comprising:
a semiconductor package substrate including a die side and a land side, with a first recess and a subsequent recess;
a first inductor coil in the semiconductor package substrate and the first recess, wherein the first recess projects a first footprint onto at least part of the first inductor coil;
a first magnetic material in interstices of the first inductor coil;
a first EMIB die in the first recess, above the first inductor coil;
a subsequent inductor coil in the semiconductor package substrate and the subsequent recess, wherein the subsequent recess projects a subsequent footprint onto at least part of the subsequent inductor coil;
a subsequent magnetic material in interstices of the subsequent inductor coil;
a subsequent EMIB die in the subsequent recess, above the subsequent inductor coil;
a dominant semiconductive device above the die side and in contact with the first EMIB die and the subsequent EMIB die;
a first semiconductive device above the die side and in contact with the first EMIB die; and
a subsequent semiconductive device above the die side and in contact with the subsequent EMIB die.

16. The semiconductor device package of claim 15, further including:
a third recess in the semiconductor package substrate;
a third inductor coil in the semiconductor package substrate and the third recess, wherein the third recess projects a third footprint onto at least part of the third inductor coil;
a third magnetic material in interstices of the subsequent inductor coil;
a third EMIB die in the third recess, above the third inductor coil; and
wherein the dominant semiconductive device is in contact with the third EMIB die.

17. The semiconductor device package of claim 15, further including:
a third recess in the semiconductor package substrate;
a third inductor coil in the semiconductor package substrate and the third recess, wherein the third recess projects a third footprint onto at least part of the third inductor coil;
a third magnetic material in interstices of the third inductor coil;
a third EMIB die in the third recess, above the third inductor coil;
a fourth recess in the semiconductor package substrate;
a fourth inductor coil in the semiconductor package substrate and the fourth recess, wherein the fourth recess projects a fourth footprint onto at least part of the fourth inductor coil;
a fourth magnetic material in interstices of the fourth inductor coil;
a fourth EMIB die in the fourth recess, above the fourth inductor coil;
wherein the dominant semiconductive device is in contact with the third and fourth EMIB dice;
a third second semiconductive device above the die side and in contact with the third EMIB die; and
a fourth semiconductive device above the die side and in contact with the fourth EMIB die.

18. The semiconductor device package of claim 15, wherein the first inductor coil has a serpentine form factor, and wherein the subsequent inductor coil has a serpentine form factor.

19. The semiconductor device package of claim 15, wherein the first inductor coil has a serpentine form factor, and wherein the subsequent inductor coil has a spiral form factor.

20. A process of forming a magnetic core inductor, comprising:
exposing at least part of an inductor coil in a recess in a semiconductor package substrate;
filling magnetic material into interstices in the inductor coil;
electrically insulating the inductor coil at exposed portions of the inductor coil;

seating a bridge die in the recess above the inductor coil and magnetic material;
connecting a dominant semiconductive device to the bridge die; and
connecting a first semiconductive device to the bridge die, to couple the dominant semiconductive device to the first semiconductive device through the bridge die.

* * * * *